(12) United States Patent
Jussila et al.

(10) Patent No.: US 9,153,975 B2
(45) Date of Patent: Oct. 6, 2015

(54) AC CONVERSION OF VARYING VOLTAGE DC SUCH AS SOLAR POWER

(75) Inventors: Matti Jussila, Helsinki (FI); Jukka Nurmi, Helsinki (FI)

(73) Assignee: ABB OY, Helsinki (FI)

( * ) Notice: Subject to any disclaimer, the term of this patent is extended or adjusted under 35 U.S.C. 154(b) by 506 days.

(21) Appl. No.: 13/310,433

(22) Filed: Dec. 2, 2011

(65) Prior Publication Data

US 2012/0139346 A1 Jun. 7, 2012

(30) Foreign Application Priority Data

Dec. 3, 2010 (EP) .................................... 10193717

(51) Int. Cl.

| | | |
|---|---|---|
| H02J 1/00 | (2006.01) | |
| H02J 3/00 | (2006.01) | |
| H02J 7/00 | (2006.01) | |
| H02J 1/10 | (2006.01) | |
| B23K 11/24 | (2006.01) | |
| H02J 3/38 | (2006.01) | |
| H01L 25/00 | (2006.01) | |
| H01L 31/00 | (2006.01) | |
| G06F 1/26 | (2006.01) | |

(52) U.S. Cl.
CPC ............... *H02J 7/0024* (2013.01); *B23K 11/24* (2013.01); *H02J 1/10* (2013.01); *H02J 3/383* (2013.01); *H02J 7/0065* (2013.01); *G06F 1/26* (2013.01); *H01L 25/00* (2013.01); *H01L 31/00* (2013.01); *Y02E 10/563* (2013.01); *Y10T 307/653* (2015.04)

(58) Field of Classification Search
CPC .......... H02J 1/10; H02J 7/0024; B23K 11/24; G06F 1/26; H01L 31/00; H01L 25/00; F41B 6/00; H01J 7/35; Y02T 10/7055; G05F 1/622

USPC .................. 307/43, 44, 46, 71; 136/243, 244; 700/297, 298
See application file for complete search history.

(56) References Cited

U.S. PATENT DOCUMENTS 7,709,727 B2 * 5/2010 Roehrig et al. ................ 136/243
2005/0172995 A1 8/2005 Rohrig et al.
(Continued)

FOREIGN PATENT DOCUMENTS

| WO | WO 2010/070114 A2 | 6/2010 |
|---|---|---|
| WO | WO 2010/070115 A2 | 6/2010 |
| WO | WO 2010/087804 A1 | 8/2010 |

OTHER PUBLICATIONS

European Search Report issued on Jul. 29, 2011.

*Primary Examiner* — Rexford Barnie
*Assistant Examiner* — Jagdeep Dhillon
(74) *Attorney, Agent, or Firm* — Buchanan Ingersoll & Rooney PC

(57) ABSTRACT

An alternating current conversion method and system are disclosed that can adapt to varying voltages of the direct current sources. An exemplary system includes a first and second connection arrangements for the voltage sources such that the direct current can be supplied to the DC/AC converter selectively in the first connection arrangement or the second connection arrangement. The selection between the first and second connection arrangements is made on the basis of the voltage levels of the voltage sources such that a proper voltage is supplied to the DC/AC converter. The numbers of the voltage sources in the connection arrangements are selected such that the first and second connection arrangements have different numbers of the voltage sources connected in series, the voltage sources being also grouped in parallel groups.

19 Claims, 6 Drawing Sheets

(56) References Cited

U.S. PATENT DOCUMENTS

| | | |
|---|---|---|
| 2007/0108843 A1* | 5/2007 | Preston et al. ................ 307/112 |
| 2009/0206666 A1* | 8/2009 | Sella et al. ..................... 307/43 |
| 2010/0180926 A1 | 7/2010 | Akerberg et al. |
| 2010/0198424 A1* | 8/2010 | Takehara et al. .............. 700/298 |
| 2010/0250018 A1 | 9/2010 | Hauf et al. |

* cited by examiner

US 9,153,975 B2

AC CONVERSION OF VARYING VOLTAGE DC SUCH AS SOLAR POWER

RELATED APPLICATION

This application claims priority under 35 U.S.C. §119 to European Patent Application No. 10193717.5 filed in Europe on Dec. 3, 2010, the entire content of which is hereby incorporated by reference in its entirety.

TECHNICAL FIELD

1. Field

The present disclosure relates to methods and systems for converting direct current supplied by a number of voltage sources to an alternating current via a DC/AC converter.

For example, methods and systems as disclosed are suitable for use in connection with direct current sources that have varying voltage levels. One example of these is a solar power plant having a DC/AC converter and a number of photovoltaic solar panels electrically connected thereto as the voltage sources.

2. Background Information

Both WO 2010/070114 A2 and WO 2010/070115 A2 disclose photovoltaic power systems, e.g. solar panel systems, having a photovoltaic source and being arranged to generate an output voltage, which is essentially uninfluenced by variable irradiation or weather conditions.

As described in the WO publications, previous photovoltaic sources, such as photovoltaic modules having several photovoltaic cells, receive unaffected irradiation from the sun for optimal operation. Additionally, the output voltage is directly dependent on the degree of the instantaneous irradiation. Thus, when a cloud is shading the photovoltaic source the output voltage of the photovoltaic system is decreased. The direct correlation between the instantaneous irradiation and the output voltage is a major issue for locations having a varying degree of irradiation.

A power mains, to which a photovoltaic source is arranged to feed electricity, receives alternating current at a specific voltage level. In order to fulfil these specifications a DC/AC converter is arranged between the photovoltaic source and the power mains, which converter should be arranged to operate at as wide an input voltage range as possible in order to manage the varying output voltage from the photovoltaic source. A converter managing a wide input voltage range is proportionately expensive as it can include more than one stage. A known way of managing a greatly varying input voltage is to use a boost DC/DC converter to provide a reasonable input voltage to said DC/AC converter. However, the use of a boost DC/DC converter at this stage can reduce the efficiency of the photovoltaic system.

The WO publications describe providing the photovoltaic system with a voltage adding arrangement having a voltage source and first and second routes. The first route includes the voltage source and the second route constitutes a voltage source bypass. The voltage adding arrangement is connected in series with the photovoltaic source and the first and second routes are alternately activatable. This voltage adding arrangement furthermore includes a charger device connected to the voltage source of the first route.

Thus, the WO publications disclose voltage sources connected in series with the photovoltaic source to add voltage when occasionally desired in order to get a less variable output voltage from the photovoltaic system. The voltage source may be a fixed voltage source or a regulated voltage source. The voltage source can include at least two batteries, which are individually connectable in series with the first route and with each other. As such, the added voltage from the voltage source may be added in a stepwise manner in order to get an as invariable output voltage of the photovoltaic system as possible.

The above referred solutions disclosed in WO 2010/070114 A2 and WO 2010/070115 A2 can effectively provide an invariable input voltage to a DC/DC converter. However, the arrangements can be somewhat complicated and involve additional devices, such as batteries and charger device to be added to the photovoltaic power system.

SUMMARY

A method of converting direct current supplied by a number of voltage sources to an alternating current via a DC/AC converter is disclosed, the method comprising: providing a first connection arrangement, wherein the voltage sources are connected to form parallel groups of voltage sources, each group having a first number Y of the voltage sources connected in series, and the number Y is an integer number greater than a second number X which number X is an integer number greater than 1; providing a second connection arrangement, wherein the voltage sources are connected to form parallel groups of voltage sources, each group having the second number X of the voltage sources connected in series; and responsive to voltage levels of the voltage sources, selectively supplying the direct current to the DC/AC converter in the first connection arrangement or the second connection arrangement.

An alternating current source system is also disclosed, comprising direct current inputs connectable to a number of voltage sources; a DC/AC converter for converting direct current supplied to the direct current inputs into alternating current; and a switching arrangement for connecting the voltage sources selectively to form a first connection arrangement and a second connection arrangement; wherein the first connection arrangement has parallel groups of voltage sources, each group having a first number Y of the voltage sources connected in series, wherein the number Y is an integer number greater than a second number X which number X is an integer number greater than 1; and wherein the second connection arrangement has parallel groups of voltage sources, each group having the second number X of the voltage sources connected in series.

A solar power plant is also disclosed, comprising a number of photovoltaic solar panels; a DC/AC converter; and a switching arrangement configured to electrically connect the photovoltaic solar panels to the DC/AC converter selectively in a first connection arrangement and a second connection arrangement; wherein the first connection arrangement has parallel groups of photovoltaic solar panels, each group having a first number Y of the photovoltaic solar panels connected in series, wherein the number Y is an integer number greater than a second number X which number X is an integer number greater than 1; and wherein the second connection arrangement has parallel groups of photovoltaic solar panels, each group having the second number X of the photovoltaic solar panels connected in series.

DETAILED DESCRIPTION

Figure 1:
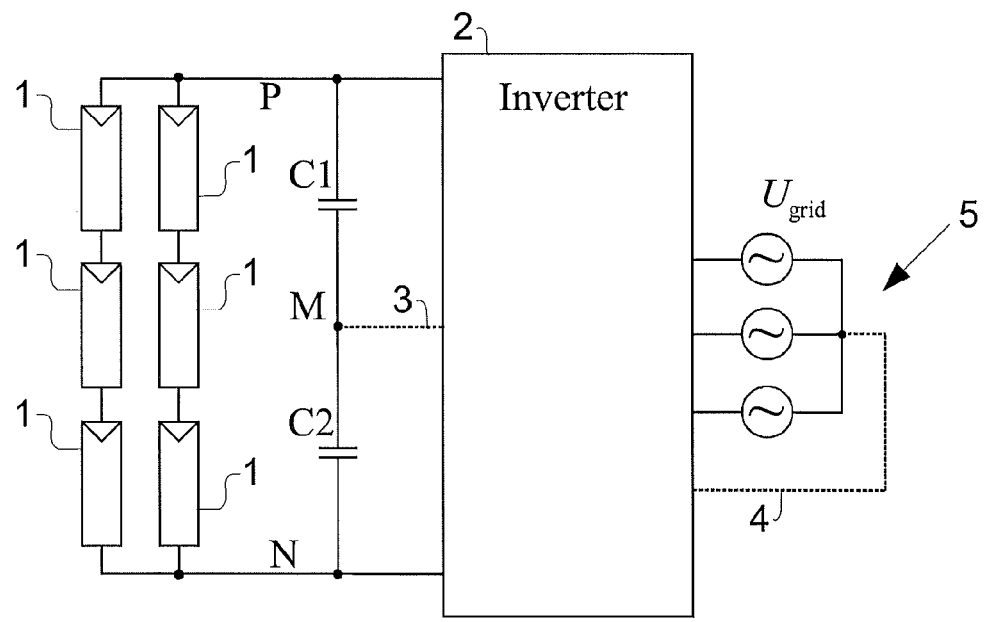
FIG. 1 presents an exemplary embodiment having six solar panels connected according to a first connection arrangement.

An alternating current conversion method and system are disclosed that can adapt to varying voltages of the direct current sources.

An exemplary method of converting direct current to an alternating current comprises providing a first and second connection arrangements for the voltage sources such that the direct current can be supplied to the DC/AC converter selectively in the first connection arrangement or the second connection arrangement. The selection between the first and second connection arrangements can be made on the basis of the voltage levels of the voltage sources such that a proper voltage is supplied to the DC/AC converter.

According to another exemplary aspect, the alternating current source comprises a switching arrangement for connecting the voltage sources selectively to form a first connection arrangement and a second connection arrangement. The first and second connection arrangements comprise parallel groups of voltage sources having a different number of voltage sources in series such that voltage level supplied to the DC/AC converter can be adapted by switching between the connection arrangements.

According to a further aspect, the method and system are used in a solar power plant whereby the voltage sources are photovoltaic panels.

For example, the numbers of the voltage sources in the connection arrangements are selected such that the first connection arrangement has the voltage sources grouped in parallel groups, each group having a first number, number Y, of the voltage sources connected in series, and the second connection arrangement also has the voltage sources grouped in parallel groups, each group having a second number, number X, of the voltage sources connected in series. The numbers X and Y are selected most suitably such that X is an integer number greater than 1 and Y is an integer number greater than X.

Exemplary embodiments disclosed herein can perform such a method and construct such a system for converting direct current to alternating current that can adapt to varying voltage levels from the direct current sources.

One exemplary embodiment is the use of such method and system in solar power plants that produce alternating current from photovoltaic voltage sources. In such applications, DC voltage levels vary due to varying degree of irradiation but the generated alternating voltage should still have less varying properties.

Other embodiments are also described herein which can provide additional benefits.

For example, in an embodiment wherein the switching arrangement comprises relays for mainly conducting the current as well as semiconductor switches for providing a bypass route for bypassing the relays during the changing of the states of the relays, the power dissipation of the switching arrangement can be kept low without compromising the ability of the system to perform the switching. This is due at least in part because in the steady states, the current can be lead through the relays and the semiconductor switches can be in non-conducting states. Conversely, the semiconductor switches can be turned to conducting states for the period of the switching operation and thereby the current can flow uninterrupted.

In embodiments, wherein both the first and second connection arrangements utilize all of the voltage sources, the power production efficiency can be kept high as all of the voltage sources are in production irrespective of the instant connection arrangement.

Exemplary embodiments as disclosed herein include generally three special features. One is the switching of the connections of the voltage sources within the DC/AC converter, or in a separate assembly outside the converter, such that the applicable DC voltage range of the voltage sources widens but is still within practical limits even without choppers. This switching can be realized in several different ways. One of these possible ways is a special relay connection, which is another special feature of the embodiments described below. The third special feature is a bypass circuit that can be connected parallel with the relay. This bypass circuit makes it possible to a) open the relays also in conducting state and b) controlled voltage gradient in the intermediate circuit's capacitors.

On a circuit level, there are various possible embodiments that can be used. The embodiments described in this specification give therefore only some examples of the possible construction. Embodiments can also be used in connection with other than solar-based voltage sources. In addition, the number of phases need not necessarily be three but any other alternating current system is applicable as well. Thus, the invention is not limited to the embodiments and examples given in the specification but cover a great variety of different applications. However, the embodiments are described in the following mainly in context of three phase AC system and using solar energy sources.

When using an inverter with a zero conductor, such that the intermediate circuit's middle point is connected to the neutral conductor of the electric power network, there is a theoretical minimum for the intermediate circuit voltage. This theoretical minimum voltage is twice the peak voltage $\hat{u}_{grid}$ of a single phase in the fed electric power network, or in other words, the peak-to-peak voltage of the produced AC voltage. Thus, in the European 400 V electric power network, an exemplary intermediate circuit voltage has to be at least 654 V ($=2\hat{u}_{grid}$).

On the other hand, if an inverter is used that does not have a zero conductor connected to the neural conductor of the electric power network, the theoretical minimum for the exemplary intermediate circuit voltage is $\sqrt{3}\hat{u}_{grid}$, which is 566 V.

The intermediate circuit voltage also has a practical maximum, which is determined by the maximum input voltage that can be connected to the semiconductor switches of the inverter. In the case where it is desired to keep losses reasonable and use generally available power semiconductor switches, such as IGBT or MOSFET switches, a voltage of 1 200 V, or of approximately the same level (e.g., ±10%), can be considered as the practical maximum voltage. The maximum voltage can be achieved by the photovoltaic unit when the solar panels of the unit are unloaded.

If two solar panels are used in series as a photovoltaic unit, an exemplary maximum voltage of such solar panels should be about 600 V and an exemplary minimum voltage should be about 330 V or about 283 V depending on the type of the inverter used, as discussed above. However, even single phase inverters without choppers can allow an input voltage range of 330 V . . . 900 V. Therefore, the use of two solar panels in series has a limited applicability in practical applications.

In theory, two solar panels (or units) with a maximum output voltage of 1 200 V could be switched between series connection and parallel connection to cover the possible input voltage range on an inverter. Then (without an inverter zero connection), the solar panels would be held in series when their voltages are below about 566 V (total voltage about 1132 V) and connected parallel when their voltages exceed about 566 V. However, in practice, some voltage marginal is needed and this theoretically applicable embodiment is seldom useful for practical applications.

Therefore, in present embodiments, the connection is done such that it is possible to adjust the number of solar panels connected in series. Thus, for instance, it is possible to switch between 2 solar panels in series and 3 solar panels in series. Any solar panels excluded from the series connection are preferably connected to form parallel series connections so that all of the solar panels can be kept in production. Furthermore, the number of series connected solar panels does not necessarily need to be 2 or 3 but can be any suitable number sufficiently differing from each other. Thus, the numbers can be, for example, 3 and 4; 3 and 5; 4 and 6 etc.

FIG. 1 shows an embodiment having six solar panels, or solar units 1. The term solar unit 1 refers to a solar panel or other set of solar cells or any other form of photovoltaic voltage sources that are treated as a single unit. Thus, a solar panel is an example of a solar unit 1. In the embodiment of FIG. 1, the inverter 2 is of the type having a zero voltage connection. Thus, the inverter 2 has a zero conductor 3, such that the intermediate circuit's middle point M is connected to the neutral conductor 4 of the electric power network 5. However, the same principles apply also to embodiments without zero voltage connections, taking however into account the voltage level considerations described above.

To feed the electric power network 5 on a European voltage-level, the connection arrangement of the solar units 1 shown in FIG. 1 is operational when the output voltage of each single solar unit 1 is at least 218 V, thus producing an output voltage for the connection arrangement of at least 3×218 V=654 V. Herein, the output voltage of the connection arrangement corresponds to the input voltage of the inverter 2, which is represented by the voltage between the poles P and N in FIG. 1.

Figure 2:
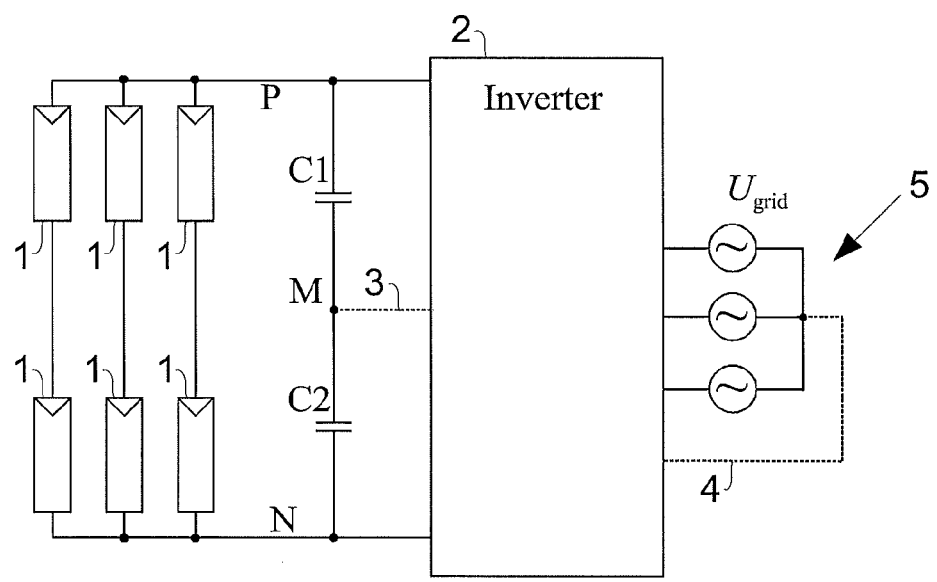
FIG. 2 presents an exemplary embodiment of FIG. 1 connected according to a second connection arrangement.

When the voltages of the solar units 1 of FIG. 1 raise above about 327 V, the connection arrangement can be switched to that shown in FIG. 2. The connection arrangement of the solar units 1 shown in FIG. 2 is operational when the output voltage of each single solar unit 1 is, for example, at least 327 V, thus producing an output voltage for the connection arrangement of at least 2×327 V=654 V. Thus 327 V can also be the maximum voltage that a single solar unit 1 has to produce in the connection arrangement shown in FIG. 1 when switching from the first connection arrangement shown in FIG. 1 to the second connection arrangement shown in FIG. 2. In the connection arrangement shown in FIG. 1, the single solar unit 1 voltage of 327 V can get the input voltage of the inverter 2 as high as 981 V (3×327 V=981 V), which is still safely below the theoretical maximum of 1 200 V. This means the switching between the connection arrangements can be made with a sufficient safety margin. Then, in the connection arrangement shown in FIG. 2, the voltages of each of the solar units 1 can raise as high as 600 V without risk to the semiconductor switches of the inverter 2. Thus, by switching between the first and second connection arrangements described above, the voltages of the solar units 1 can range between 218 V . . . 600 V, which well corresponds to the requirements of practical applications.

In other words, FIGS. 1 and 2 relate to an alternating current source that comprises six solar units 1 for supplying direct current and an inverter 2 acting as a DC/AC converter for converting the supplied direct current into alternating current. In addition, the alternating current source of FIGS. 1 and 2 comprises a switching arrangement for connecting the voltage sources selectively to form a first connection arrangement and a second connection arrangement. Such switching arrangement is not shown in FIGS. 1 and 2 but any suitable switching arrangement can be used, several possibilities of which are describes later in the present specification.

In the first connection arrangement shown in FIG. 1, there are 2 parallel groups of solar units 1, each group having 3 solar units 1 connected in series. In the second connection arrangement shown in FIG. 1, there are 3 parallel groups of solar units 1, each group having 2 solar units 1 connected in series. In this embodiment, the first connection arrangement shown in FIG. 1 is used in the lower range of solar unit voltages (e.g. 218 V . . . 327 V) and the second connection arrangement shown in FIG. 2 is used in the higher range of solar unit voltages (e.g. 327 V . . . 600 V). Therefore, the alternating current source can effectively cover the entire range of solar unit voltages from 218 V to 600 V.

In the embodiment of FIGS. 1 and 2, the voltage sources are solar units 1, but in general any direct voltage sources can be used, for example such direct voltage sources that have some variation in their output voltages, for instance due to environmental factors.

In the embodiment of FIGS. 1 and 2, the number of voltage sources is 6 (2×3), but the number can be any suitable number greater than 6. Other possibilities include, but are not limited to, 12 (3×4), 15 (3×5), 20 (4×5), 24 (4×6), 28 (4×7), 30 (5×6), 35 (5×7), 40 (5×8) etc. In general, the number of voltage sources is X times Y such that X is an integer number greater than 1 and Y is an integer number greater than X. In many applications, it is furthermore beneficial that Y is less than two times X (Y<2x) so that the voltage ranges of the connection arrangements sufficiently overlap in order to provide an appropriate operating margin.

Figure 3:
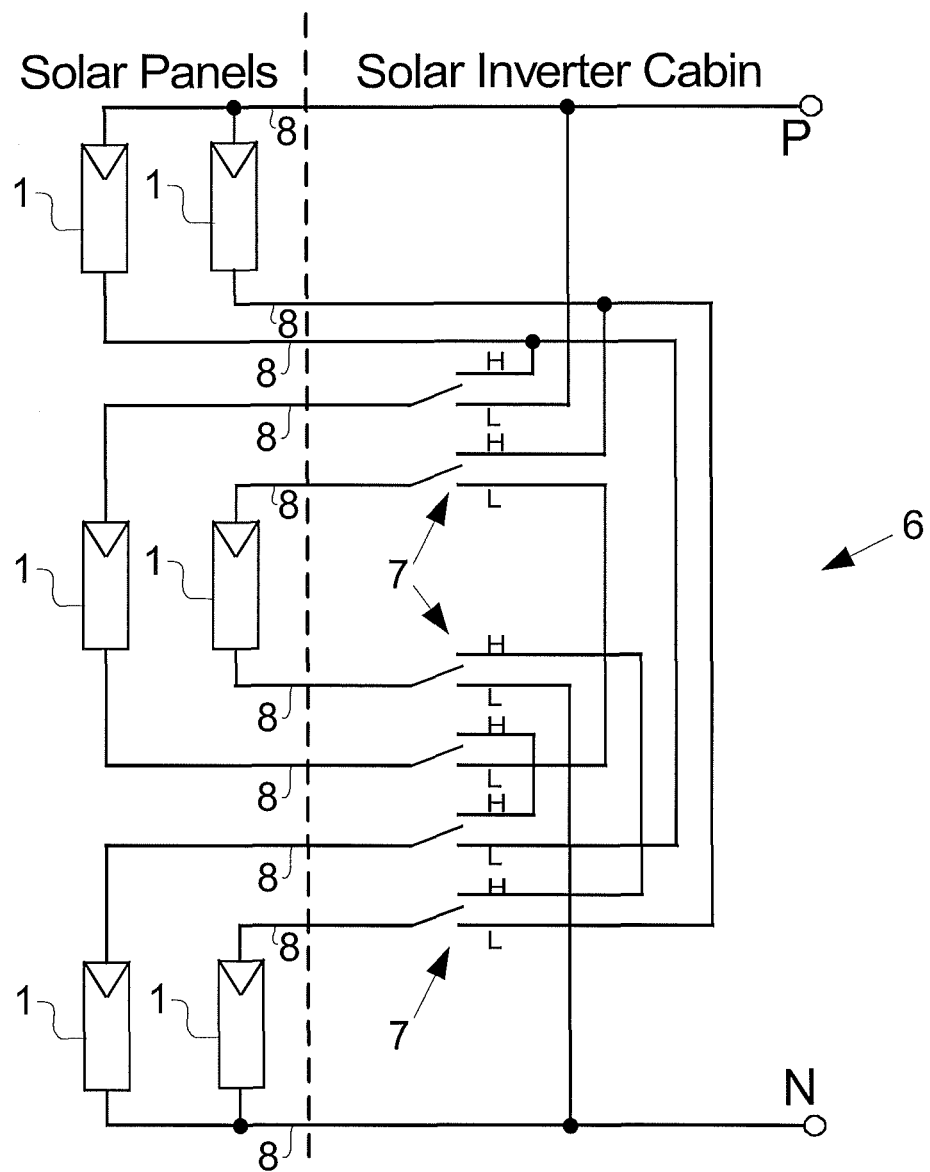
FIG. 3 shows an exemplary embodiment of a switching arrangement that can be used to switch between connection arrangements, such as those of FIGS. 1 and 2.

FIG. 3 shows an exemplary embodiment of the switching arrangement 6 that can be used to switch between the first and second connection arrangements of FIGS. 1 and 2. In the embodiment of FIG. 3, when the switches 7 of the switching arrangement 6 are in state H, the solar units 1 are connected according to the first connection arrangement shown in FIG. 1, and when the switches 7 of the switching arrangement 6 are in state L, the solar units 1 are connected according to the second connection arrangement shown in FIG. 2. The embodiment of FIG. 3 uses 10 panel conductors 8 and 6 switches 7.

Figure 4:
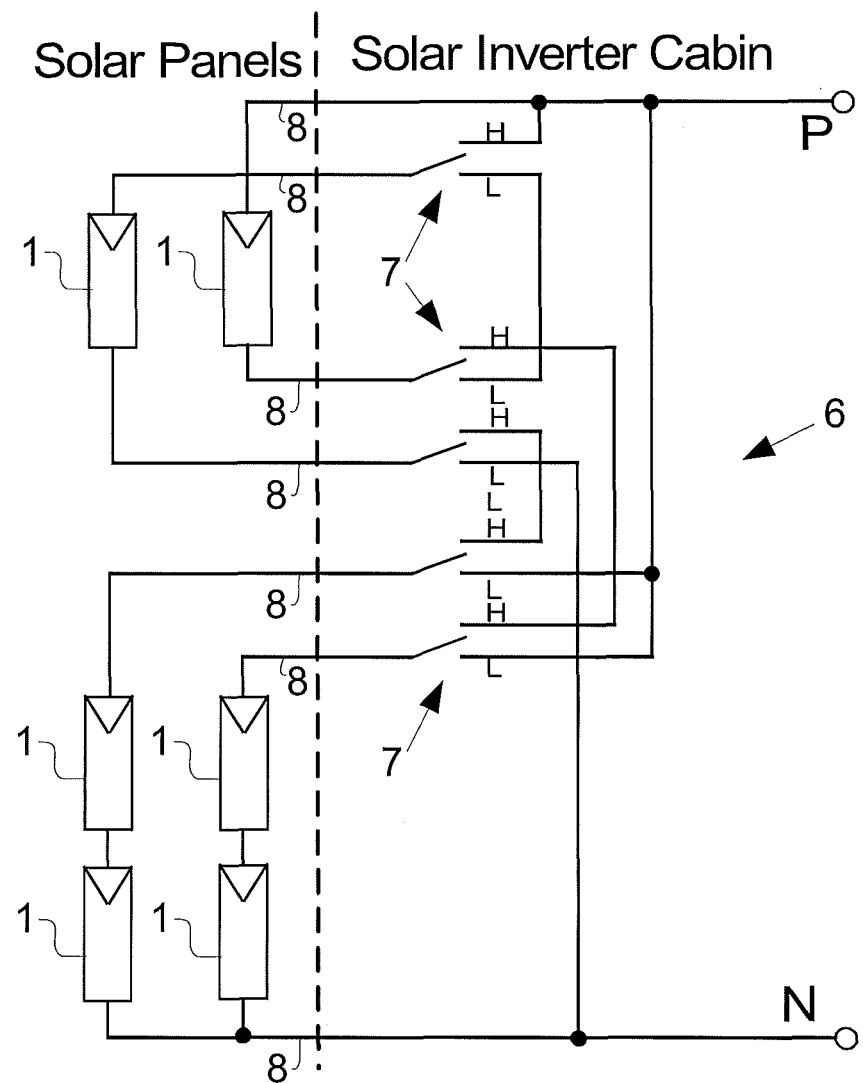
FIG. 4 shows another exemplary embodiment of a switching arrangement that can be used to switch between connection arrangements, such as those of FIGS. 1 and 2.

FIG. 4 shows another exemplary embodiment of the switching arrangement 6 that can be used to switch between the first and second connection arrangements of FIGS. 1 and 2. Just as in the embodiment of FIG. 3, the H state of the switches 7 corresponds to the first connection arrangement shown in FIG. 1, and the L state of the switches 7 connect the solar units 1 according to the second connection arrangement shown in FIG. 2. The embodiment of FIG. 4 uses 7 panel conductors 8 and 5 switches 7.

FIGS. 3 and 4 indicate also one possible location of the various parts of the system in an embodiment that comprises a solar inverter cabin for accommodating some of the equipment. In this embodiment, the switching arrangement 6 is located within the solar inverter cabin together with the inverter 2 and the capacitors C1 and C2 shown in FIGS. 1 and 2. Then, the solar inverter cabin can have suitable connectors for the input voltages, that is the inputs from the voltage sources. This embodiment provides conveniently one solar inverter cabin which is then appropriately connected to the solar panels by means of suitable panel conductors 8. Of course, other realizations are also possible. One variation is to use a separate switching arrangement 6 in a separate cabin between the solar panels and the inverter 2.

The switches 7 in the embodiments of FIGS. 3 and 4 can be relays, whereby the switching circuit's power dissipation is negligible in the on-state of the circuit. According to an embodiment, the relays are bipolar relays and are all controlled with the same control signal. The relays are either in the L state, whereby the connection is for example according to FIG. 2, or in the H state, whereby the connection is for example according to FIG. 1. The switching arrangement 6 can be constructed as well by means of unipolar relays or other switches 7.

In a further embodiment, the switches 7, such as the relays, are bypassed by means of semiconductor switches during the switching operation. This provides the benefit that the switches 7, such as the relays, need not be suitable for breaking direct current. Instead, the semiconductor switches provide bypass routes for the direct current for the period of changing the states of the relays. After the switching period, the semiconductor switches can be turned off again whereby they do not dissipate power and the above-referred negligible power dissipation is achieved in the switching arrangement 6.

Some embodiments of the switching arrangement 6 comprising semiconductor switch bypass routes are shown in FIGS. 5-8.

Figure 5:
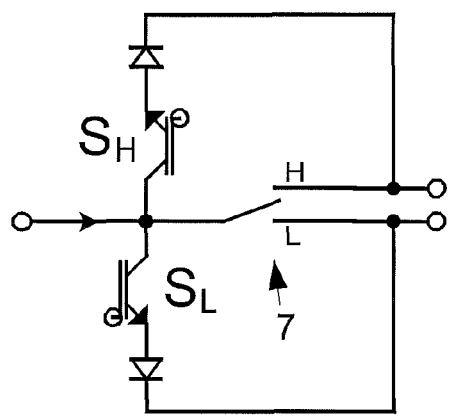
FIG. 5 presents a switch and a bypass according to an exemplary embodiment.
Figure 6:
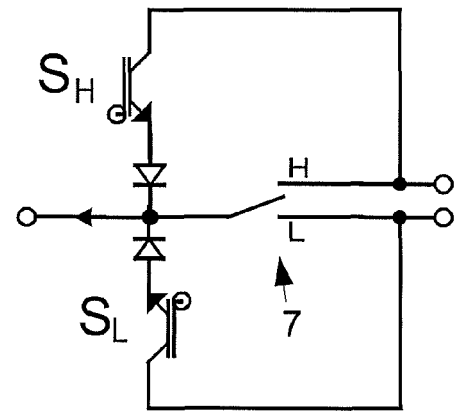
FIG. 6 presents a switch and a bypass according to another exemplary embodiment.

In the switching arrangement of FIG. 5, the semiconductor switches $S_H$ and $S_L$ are simultaneously controlled to form a conducting state whereby the direct current flowing through the switching arrangement can commute to the semiconductor switches $S_H$ and $S_L$ for the period of time specified for changing the state of the relay. FIG. 6 shows a switching arrangement equivalent to that of FIG. 5 but designed for the opposite direction of direct current. Thus, correct direction can be selected for each switch 7 in the embodiment of FIG. 4.

Figure 7:
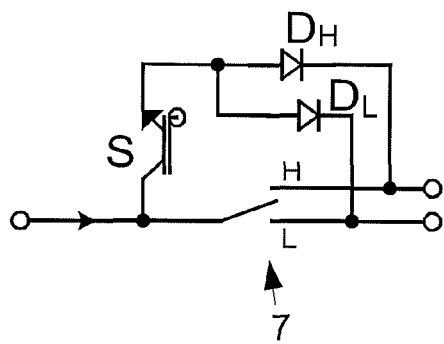
FIG. 7 presents a switch and a bypass according to a further exemplary embodiment.
Figure 8:
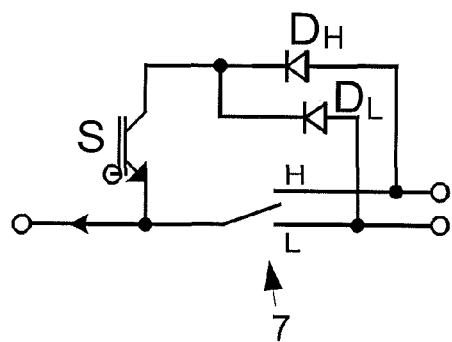
FIG. 8 presents a switch and a bypass according to a further exemplary embodiment.

In case it is not desired to use two different semiconductor switches in the switching arrangement 6, designs shown in FIGS. 7 and 8 can be used. In the switching arrangements of FIGS. 7 and 8, one single semiconductor switch takes care of the switching operation. The switching arrangement of FIG. 7 is for one direction of direct current and that of FIG. 8 is for the opposite direction.

Now referring again to the embodiment of FIGS. 1 and 2, the DC voltage $U_{IN}$ output from the solar units 1 (for $U_{IN}$ see also FIG. 9) changes when switching between the first connection arrangement and the second connection arrangement. The change can be for example from about 654 V to about 981 V when the switching is made from the connection arrangement of FIG. 2 to the connection arrangement of FIG. 1. Correspondingly, when switching from the connection arrangement of FIG. 1 to the connection arrangement of FIG. 2, the output voltage $U_{IN}$ of the solar units 1 can change for example from about 981 V to about 654 V. This means that also the voltage $U_{DC}$, which is the sum voltage over the capacitors C1 and C2, should change accordingly. If the voltage $U_{DC}$ changes abruptly, the capacitors C1 and C2 tend to charge up to the new voltage level as soon as possible, which means high charging current.

In the case of solar panels as the voltage sources, the above described change of output voltage $U_{IN}$ need not be a problem as the operating points of the solar panels can be let to freely move along the voltage-current curve of the solar panels. Then, the solar panels will be temporarily outside their maximum power zones and the operating points will naturally set such that the voltage $U_{IN}$ immediately after the switching operation corresponds to the voltage $U_{DC}$ at a moment immediately before the switching operation. When switching from the voltage of about 981 V to the voltage of about 654 V, the output voltage of any individual solar panel first abruptly falls but then raises naturally to the new maximum power level along with the charging of the capacitors C1 and C2.

According to an exemplary embodiment, it is also possible to control the voltages $U_{IN}$ and $U_{DC}$ by means of the inverter 2, which makes the change of the voltages more controlled.

Figure 9:
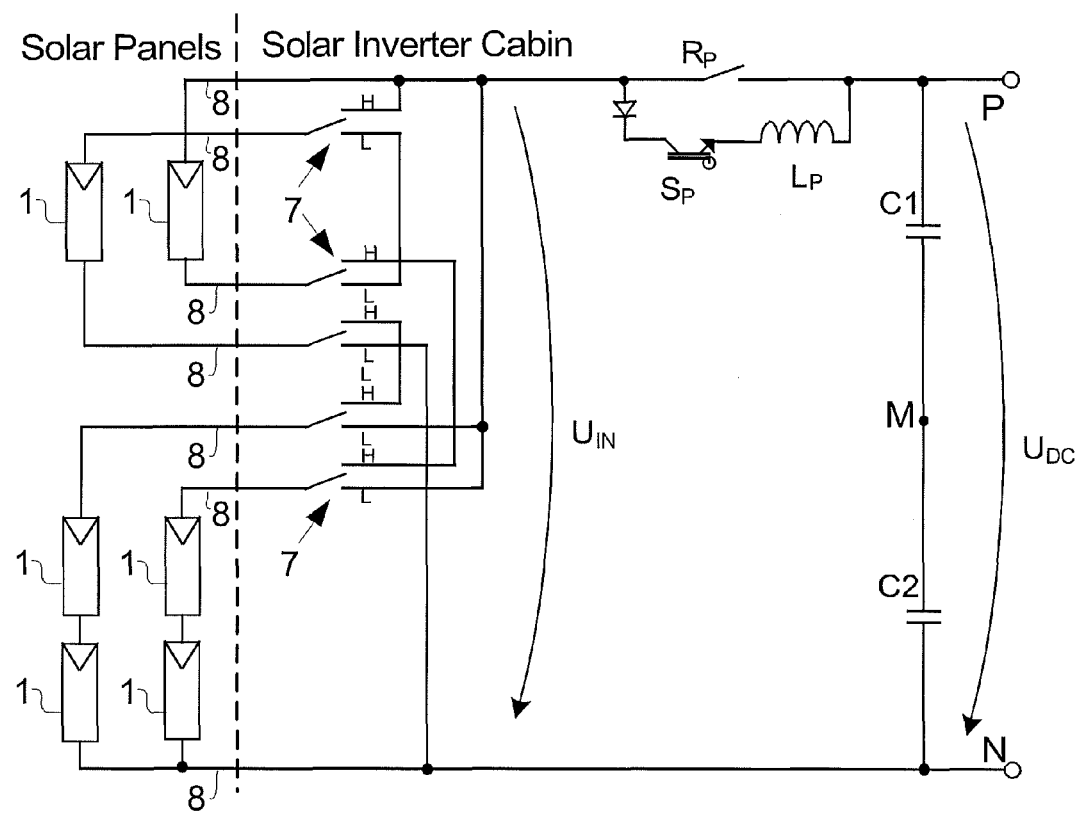
FIG. 9 shows a circuit diagram according to an exemplary embodiment.

According to a further exemplary embodiment, it is also possible to use a special circuit arrangement between the DC feed from the capacitors C1 and C2 that decouples the voltage $U_{IN}$ from the voltage $U_{DC}$ for the period of charging the capacitors C1 and C2. FIG. 9 shows one possible circuit diagram according to such an embodiment.

The circuit of FIG. 9 comprises a relay $R_P$ between the DC feed and the capacitors C1 and C2 as well as a semiconductor switch $S_P$ and an inductor $L_P$ connected in series parallel to the relay $R_P$. The circuit is configured to operate such that during the steady state, the relay $R_P$ is closed and the semiconductor switch $S_P$ is open. Then, the power dissipation is negligible. However, prior to switching between the connection arrangements, the semiconductor switch $S_P$ is closed and the relay $R_P$ opened. Then, the switching operation between the connection arrangements is performed whereby the inductor $L_P$ decouples the voltage $U_{DC}$ from the voltage $U_{DC'}$. The inductor $L_P$ restricts the charging/discharging current of the capacitors C1 and C2 and maintains a difference between the voltages $U_{DC}$ and $U_{DC'}$ for the period of changing the charging state of the capacitors C1 and C2. When the voltages $U_{DC}$ and $U_{DC'}$ have been substantially equalized, the relay $R_P$ can be closed again and the semiconductor switch $S_P$ opened.

Figure 10:
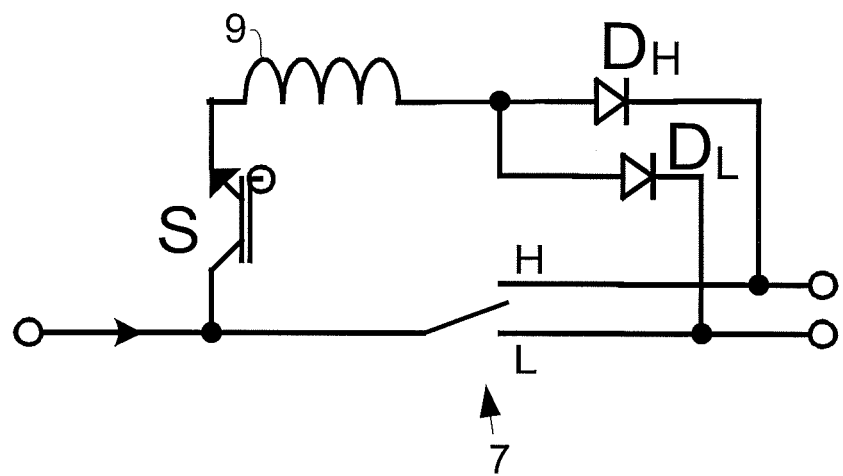
FIG. 10 presents an exemplary embodiment of a switch and a bypass route with an inductor.

It is also possible to integrate the function of the circuit of FIG. 9 and the function of the bypass routes relating to the embodiments of FIGS. 5-8. Such an exemplary embodiment might be preferred, for instance, if several smaller inductors are considered more economical that one bigger inductor and if it is desired to minimize the number of discrete components in the whole circuitry. FIG. 10 shows a circuit that can be used in an exemplary embodiment that integrates said functions. Thus, the circuit of FIG. 10 can be used to bypass the relays of the switching arrangements 6 in the above described embodiments. At the same time, an inductor 9 of the circuit can provide current limitation and the necessary voltage drop between the voltages $U_{DC}$ and $U_{DC'}$ during the transition.

Figure 11:
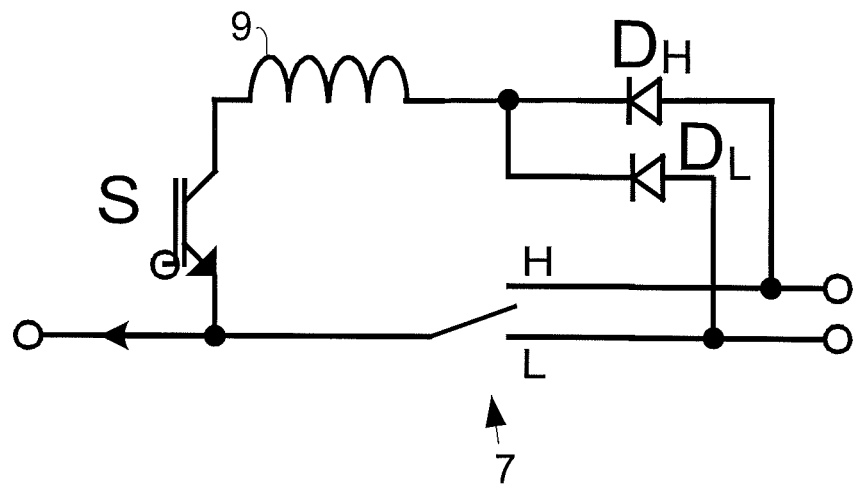
FIG. 11 presents another exemplary embodiment of a switch and a bypass route with an inductor.

FIG. 11 shows an alternative embodiment for that of FIG. 10. The embodiments of FIGS. 10 and 11 are for the opposite directions of current.

As is apparent from the above discussion, an embodiment concerns a method of converting direct current supplied by a number of voltage sources to an alternating current by means of a DC/AC converter. The voltage sources can be for example solar units 1, such as solar panels. The DC/AC converter can include an inverter 2. An exemplary method according to the embodiment comprises:

providing a first connection arrangement, wherein the voltage sources are connected to form parallel groups of voltage sources, each group having a first number, number Y, of the voltage sources connected in series, and the number Y is an integer number greater than a second number, number X, which number X is an integer number greater than 1;

providing a second connection arrangement, wherein the voltage sources are connected to form parallel groups of voltage sources, each group having the second number, the number X, of the voltage sources connected in series; and responsive to the voltage levels of the voltage sources, selectively supplying the direct current to the DC/AC converter in the first connection arrangement or the second connection arrangement.

An exemplary embodiment provides also an alternating current source system, comprising direct current inputs connectable to a number of voltage sources, and a DC/AC converter for converting the direct current supplied to the direct current inputs into alternating current. The direct current inputs refer here to input connectors or terminals via which the direct current feed can be received in the system. The connection between the direct current inputs and the voltage sources can be made by means of panel conductors 8, for instance. The alternating current source further comprises a switching arrangement 6 for connecting the voltage sources selectively to form a first connection arrangement and a second connection arrangement such that:

the first connection arrangement has parallel groups of voltage sources, each group having a first number, number Y, of the voltage sources connected in series, wherein the number Y is an integer number greater than a second number, number X, which number X is an integer number greater than 1; and the second connection arrangement has parallel groups of voltage sources, each group having the second number, number X, of the voltage sources connected in series.

According to a further exemplary embodiment, the numbers in the above embodiments are selected such that Y is less than two times X.

According to an even further exemplary embodiment, the numbers in at least one of the above embodiments are selected such that Y is greater by 1 than X.

According to an even further exemplary embodiment, the numbers in at least one of the above embodiments are selected such that X is divisible by 2 and Y is divisible by 3.

According to an even further exemplary embodiment, the numbers in at least one of the above embodiments are selected such that X is exactly 2 and Y is exactly 3.

According to even further exemplary embodiments of the method and system, the DC/AC converter has an acceptable input voltage range, which is dictated by the structure of the DC/AC converter. In addition, each of the voltage sources has an output voltage range ranging from an exemplary minimum voltage up to an exemplary maximum voltage. Both the minimum voltage and the maximum voltage can refer to such voltages under realistic production conditions. In this embodiment, the range between a typical minimum voltage and a maximum voltage can be divided into three sub-ranges, which are a lower region, an upper region and an intermediate region between the lower and upper regions. In this embodiment:

the first connection arrangement is constructed such that the direct current supplied to the DC/AC converter is within the acceptable input voltage range when the voltage levels of the voltage sources are within their lower regions but would exceed the acceptable input voltage range in their upper regions;

the first connection arrangement is constructed such that the direct current supplied to the DC/AC converter is within the acceptable input voltage range when the voltage levels of the voltage sources are within their upper regions but would fall under the acceptable input voltage range in their lower regions; and the switching between the first and second connection arrangements is performed when the voltage levels of the voltage sources are within their intermediate regions. The switching can be realized, for example, by means of a controller controlling the switching arrangement such that switching is performed when the voltage levels of the voltage sources are within their intermediate regions.

In the above embodiment, the acceptable input voltage range can be for example 500-1 500 V, such as 570-1 200 V. An exemplary minimum voltage can be for example, 50-300 V, such as 150-250 V. An exemplary maximum voltage can be for example 200-750 V, such as 400-600 V. However, these are only rough values for some embodiments, and other values are also possible according to the properties of the components used and the number of elements in the system.

In an exemplary embodiment, in which X is 2 and Y is 3 and the system produces three-phase current at the European voltage level, the acceptable input voltage range can be for example 654-1 200 V, the typical minimum voltage can be for example 218 V and the typical maximum voltage can be for example 600 V. Then, the lower region can be for example 218-327 V, the upper region can be for example 335-600 V and an intermediate region can be for example 327-335V.

According to another exemplary embodiment, every voltage source is utilized both in the first connection arrangement and the second connection arrangement. Thus, none of the voltage sources is left out of the connection arrangements but all are in production.

According to another exemplary embodiment, the numbers in at least one of the above embodiments are selected such that:

the first connection arrangement has X parallel groups of voltage sources, each group having Y voltage sources connected in series; and the second connection arrangement has Y parallel groups of voltage sources, each group having X voltage sources connected in series.

According to another exemplary embodiment, the switching arrangement 6 comprises relays and semiconductor switches providing bypass route for bypassing the relays during the changing of the states of the relays.

According to an exemplary embodiment, there is provided also a solar power plant one of the above described the alternating current source systems and a number of photovoltaic solar panels 1 electrically connected thereto as the voltage sources.

The above described embodiments are mainly directed to be used in context of three-phase inverter systems converting solar power. However, the embodiments can be adapted also for other systems, such as one-phase AC systems. Also the current feed can be from different sources, such as fuel cells.

The above description is only to exemplify the invention and is not intended to limit the scope of protection offered by the claims. The claims are also intended to cover the equivalents thereof and not to be construed literally.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

The invention claimed is:

1. A method of converting direct current supplied by a number of voltage sources to an alternating current via a DC/AC converter, the method comprising:
   providing a first connection arrangement, wherein the voltage sources are connected to form parallel groups of voltage sources, each group having a first number Y of the voltage sources connected in series, and the number Y is an integer number greater than a second number X which number X is an integer number greater than 1;
   providing a second connection arrangement, wherein the voltage sources are connected to form parallel groups of voltage sources, each group having the second number X of the voltage sources connected in series; and
   responsive to voltage levels of the voltage sources, selectively supplying by a switching arrangement the direct current to the DC/AC converter in the first connection arrangement or the second connection arrangement, wherein the switching arrangement comprises semiconductor switches providing bypass routes for bypassing relays during changing of states of the relays, and each relay is bypassed by a first bypass route including a first semiconductor switch and a second bypass route, that is in parallel to the first bypass route, which includes a second semiconductor switch.

2. The method of claim 1, wherein Y is less than two times X.

3. The method of claim 1, wherein:
   each of the voltage sources has an output voltage range with a lower region, an upper region and an intermediate region between the lower and upper regions;
   the DC/AC converter has an acceptable input voltage range;
   the first connection arrangement is constructed such that the direct current supplied to the DC/AC converter is within an acceptable input voltage range when the voltage levels of the voltage sources are within their lower regions but would exceed the acceptable input voltage range when the voltage levels of the voltage sources are in their upper regions;
   the first connection arrangement is constructed such that the direct current supplied to the DC/AC converter is within the acceptable input voltage range when the voltage levels of the voltage sources are within their upper regions but would fall under the acceptable input voltage range when the voltage levels of the voltage sources are in their lower regions; and
   the switching between the first and second connection arrangements is performed when the voltage levels of the voltage sources are within their intermediate regions.

4. The method of claim 1, wherein every voltage source is utilized both in the first connection arrangement and the second connection arrangement.

5. The method of claim 1, wherein all of the voltage sources are photovoltaic voltage sources.

6. The method of claim 1, wherein Y is less than two times X and wherein every voltage source is utilized both in the first connection arrangement and the second connection arrangement such that the number of voltage sources is Y times X.

7. An alternating current source system, comprising:
   direct current inputs connectable to a number of voltage sources;
   a DC/AC converter for converting direct current supplied to the direct current inputs into alternating current; and
   a switching arrangement for connecting the voltage sources selectively to form a first connection arrangement and a second connection arrangement, and the switching arrangement comprises semiconductor switches providing bypass routes for bypassing relays during changing of states of the relays, and each relay is bypassed by a first bypass route including a first semiconductor switch and a second bypass route that is in parallel to the first bypass route, which includes a second semiconductor switch;
   wherein the first connection arrangement has parallel groups of voltage sources, each group having a first number Y of the voltage sources connected in series, wherein the number Y is an integer number greater than a second number X which number X is an integer number greater than 1; and
   wherein the second connection arrangement has parallel groups of voltage sources, each group having the second number X of the voltage sources connected in series.

8. The alternating current source system of claim 7, wherein
   the number of voltage sources is X times Y;
   the first connection arrangement has X parallel groups of voltage sources, each group having Y voltage sources connected in series; and
   the second connection arrangement has Y parallel groups of voltage sources, each group having X voltage sources connected in series.

9. The alternating current source system of claim 8, wherein Y is less than two times X.

10. The alternating current source system of claim 7, wherein Y is greater by 1 than X.

11. The alternating current source system of claim 7, wherein X is divisible by 2 and Y is divisible by 3.

12. The alternating current source system of claim 7, wherein X is exactly 2 and Y is exactly 3.

13. The alternating current source system of claim 7, wherein all of the voltage sources are utilized in both of the first and second connection arrangements.

14. The alternating current source system of claim 7, wherein
   each of the voltage sources has an output voltage range with a lower region, an upper region and an intermediate region between the lower and upper regions;
   the DC/AC converter has an acceptable input voltage range;
   the first connection arrangement is constructed such that the direct current supplied to the DC/AC converter is within the acceptable input voltage range when the voltage levels of the voltage sources are within their lower regions but would exceed the acceptable input voltage range when the voltage levels of the voltage sources are in their upper regions;
   the first connection arrangement is constructed such that the direct current supplied to the DC/AC converter is within the acceptable input voltage range when the voltage levels of the voltage sources when the voltage levels of the voltage sources are within their upper regions but would fall under the acceptable input voltage range in their lower regions; and the alternating current source system comprises:
- a controller for controlling the switching arrangement such that switching between the first and second connection arrangements is performed when the voltage levels of the voltage sources are within their intermediate regions.

15. A solar power plant, comprising
a number of photovoltaic solar panels;
a DC/AC converter; and
a switching arrangement configured to electrically connect the photovoltaic solar panels to the DC/AC converter selectively in a first connection arrangement and a second connection arrangement, and the switching arrangement comprises semiconductor switches providing bypass routes for bypassing relays during changing of states of the relays, and each relay is bypassed by a first bypass route including a first semiconductor switch and a second bypass route, that is in parallel to the first bypass route, which includes a second semiconductor switch;
wherein the first connection arrangement has parallel groups of photovoltaic solar panels, each group having a first number Y of the photovoltaic solar panels connected in series, wherein the number Y is an integer number greater than a second number X which number X is an integer number greater than 1; and
wherein the second connection arrangement has parallel groups of photovoltaic solar panels, each group having the second number X of the photovoltaic solar panels connected in series.

16. The solar power plant of claim 15, wherein
the number of photovoltaic solar panels is X times Y;
the first connection arrangement has X parallel groups of photovoltaic solar panels, each group having Y photovoltaic solar panels connected in series; and
the second connection arrangement has Y parallel groups of photovoltaic solar panels, each group having X photovoltaic solar panels connected in series.

17. The solar power plant of claim 16, wherein Y is less than two times X.

18. The solar power plant of claim 16, wherein
each of the photovoltaic solar panels has an output voltage range with a lower region, an upper region and an intermediate region between the lower and upper regions;
the DC/AC converter has an acceptable input voltage range;
the first connection arrangement is constructed such that the direct current supplied to the DC/AC converter is within the acceptable input voltage range when the voltage levels of the photovoltaic solar panels are within their lower regions but would exceed the acceptable input voltage range when the voltage levels of the voltage sources are in their upper regions;
the first connection arrangement is constructed such that the direct current supplied to the DC/AC converter is within the acceptable input voltage range when the voltage levels of the photovoltaic solar panels are within their upper regions but would fall under the acceptable input voltage range when the voltage levels of the voltage sources are in their lower regions; and
the solar power plant comprises:
- a controller for controlling the switching arrangement such that switching between the first and second connection arrangements is performed when the voltage levels of the photovoltaic solar panels are within their intermediate regions.

19. An alternating current source system, comprising:
direct current inputs connectable to a number of voltage sources;
a DC/AC converter for converting direct current supplied to the direct current inputs into alternating current; and
a switching arrangement for connecting the voltage sources selectively to form a first connection arrangement and a second connection arrangement, and the switching arrangement comprises semiconductor switches providing bypass routes for bypassing relays during changing of states of the relays, and each relay is bypassed by a first bypass route and a second bypass route both including a common portion going through a common semiconductor switch and, in addition to the common portion, the first bypass route including a first portion including a first diode and the second bypass route including a second portion including a second diode, wherein the first portion is in parallel to the second portion;
wherein the first connection arrangement has parallel groups of voltage sources, each group having a first number Y of the voltage sources connected in series, wherein the number Y is an integer number greater than a second number X which number X is an integer number greater than 1; and
wherein the second connection arrangement has parallel groups of voltage sources, each group having the second number X of the voltage sources connected in series.

* * * * *